(12) United States Patent
Kim

(10) Patent No.: US 7,696,601 B2
(45) Date of Patent: Apr. 13, 2010

(54) SEMICONDUCTOR DEVICE WITH SEG FILM ACTIVE REGION

(75) Inventor: Young Bog Kim, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 188 days.

(21) Appl. No.: 11/637,165

(22) Filed: Dec. 12, 2006

(65) Prior Publication Data

US 2007/0278610 A1    Dec. 6, 2007

(30) Foreign Application Priority Data

May 30, 2006   (KR)   .................. 10-2006-0048670

(51) Int. Cl.
*H01L 29/00*  (2006.01)
*H01L 29/76*  (2006.01)
*H01L 29/94*  (2006.01)
*H01L 31/062* (2006.01)
*H01L 23/58*  (2006.01)

(52) U.S. Cl. .................. 257/506; 257/330; 257/647; 257/E21.54

(58) Field of Classification Search ............... 257/330, 257/331, 506, 513, 647, 649, E27.001, E21.54
See application file for complete search history.

(56) References Cited

U.S. PATENT DOCUMENTS

| 6,214,653 B1* | 4/2001 | Chen et al. .................. 438/153 |
| 2001/0010376 A1* | 8/2001 | Noble .................. 257/288 |
| 2002/0052077 A1* | 5/2002 | Tee et al. .................. 438/239 |
| 2002/0163038 A1* | 11/2002 | Chang et al. .................. 257/338 |
| 2005/0277261 A1* | 12/2005 | Jung .................. 438/413 |
| 2006/0091454 A1 | 5/2006 | Uchiyama | |

FOREIGN PATENT DOCUMENTS

| KR | 10-2000-0042851 A | 7/2000 |
| KR | 10-2002-0008469 A | 1/2002 |
| KR | 10-2005-0043424 A | 5/2005 |
| KR | 10-2005-0112262 A | 11/2005 |
| KR | 10-2005-0118550 A | 12/2005 |

* cited by examiner

*Primary Examiner*—Shouxiang Hu
(74) *Attorney, Agent, or Firm*—Townsend and Townsend and Crew LLP

(57) ABSTRACT

A semiconductor device and a method for manufacturing the same are provided. A barrier film is formed in a device separating structure, and the device separating structure is etched at a predetermined thickness to expose a semiconductor substrate. Then, a SEG film is grown to form an active region whose area is increased. As a result, a current driving power of a transistor located at a cell region and peripheral circuit regions is improved.

7 Claims, 7 Drawing Sheets

SEMICONDUCTOR DEVICE WITH SEG FILM ACTIVE REGION

CROSS-REFERENCES TO RELATED APPLICATIONS

The present application claims priority to Korean patent application number 10-2006-0048670, filed on May 30, 2005, which is incorporated by reference in its entirety.

BACKGROUND OF THE INVENTION

The present invention generally relates to a semiconductor device and its method of manufacture, and, more specifically, to a method for forming a barrier film in a device separating structure, etching the device separating structure at a predetermined depth to expose a semiconductor substrate, and growing a SEG film to form an active region having an increased area.

FIG. 1 is a plane diagram illustrating a conventional semiconductor device.

Referring to FIG. 1, a recess gate 20 is formed perpendicular to an active region 10 in a semiconductor substrate having a device separating structure that defines the active region 10.

When a trench for defining the active region is formed over the semiconductor substrate and then filled with an oxide film to form a device separating structure, the area of the active region is decreased due to recent decrease in the size of the semiconductor device.

In the above-described method for manufacturing a semiconductor device, after the device separating structure is formed, the semiconductor substrate of the active region is etched at a predetermined thickness to form a recess gate region and a gate pattern. However, the area of the active region is decreased as the design rule is decreased. As a result, the current driving power is degraded as much as the decreased area of the active region.

BRIEF SUMMARY OF THE INVENTION

Various embodiments of the present invention are directed at providing a semiconductor device and its method of manufacture, which includes forming a barrier film in a device separating structure, etching the device separating structure at a predetermined depth to expose a semiconductor substrate, and growing a SEG film to form an active region whose area is increased.

According to an embodiment of the present invention, a semiconductor device comprises a first device separating structure that defines a first active region, a second device separating structure extended to the side surface of the first active region so as to define a second active region overlapped with the first device separating structure, a line-type barrier film extended along the major axis of the active regions and formed in a device separating region between the active regions, and a recess gate perpendicular to the active region and having a recess formed in the active region.

According to an embodiment of the present invention, a method for manufacturing a semiconductor device comprises the steps of: forming a first device separating structure that defines a first active region over a semiconductor substrate; forming a trench in a predetermined region of the first device separating structure; forming a barrier film for filling the trench; etching the first device separating structure at a predetermined depth to expose the sidewall of the first active region; growing the first active region to form a SEG film between the first active region and the barrier film, thereby forming a second active region extended from the first active region to the side; and, forming a second device separating structure between the second active region.

DETAILED DESCRIPTION OF THE SPECIFIC EMBODIMENT

The present invention will be described in detail with reference to the accompanying drawings.

Figure 1:
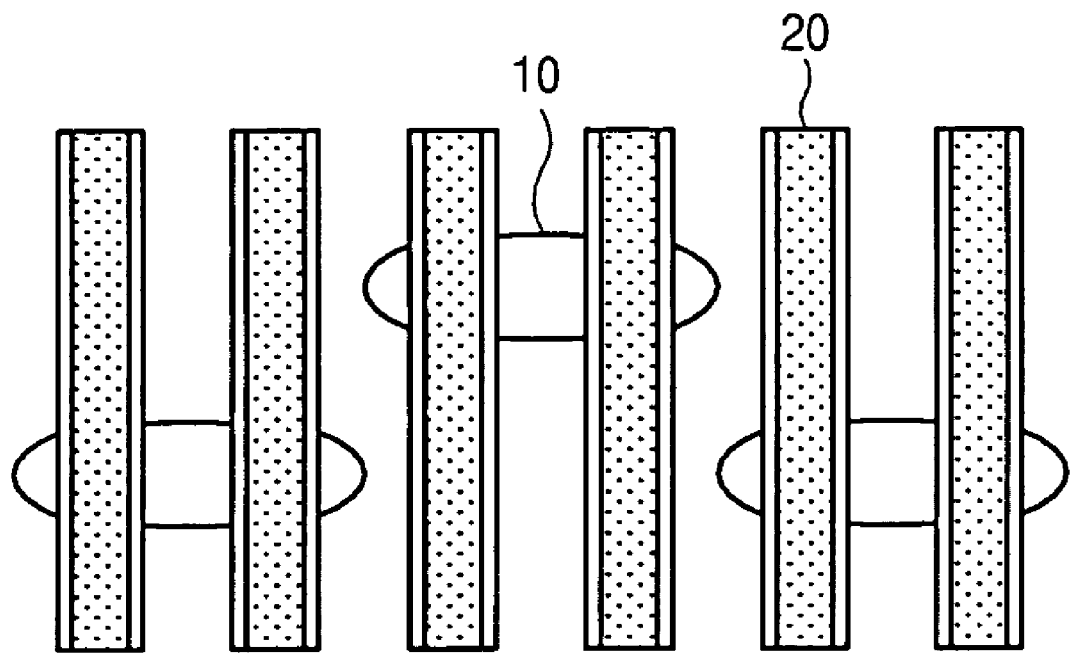
FIG. 1 is a plane diagram illustrating a conventional semiconductor device.
Figure 2:
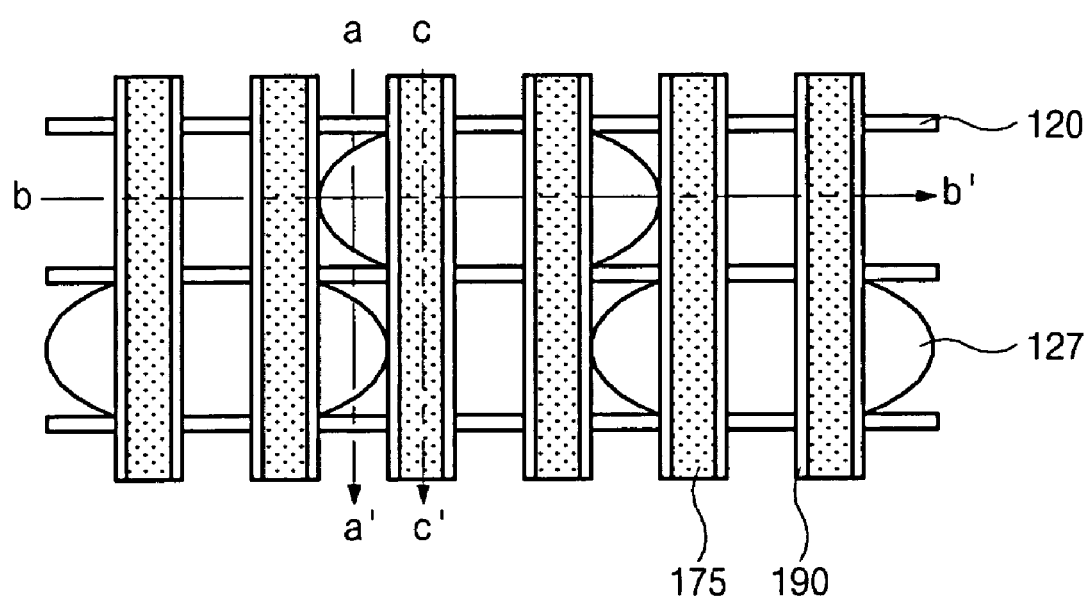
FIG. 2 is a plane diagram illustrating a semiconductor device according to an embodiment of the present invention.

FIG. 2 is a plane diagram illustrating a conventional semiconductor device.

Referring to FIG. 2, a first device separating structure that defines a first active region and a second device separating structure extended to the side surface of the first active region so as to define a second active region overlapped with the first device separating structure are formed over a semiconductor substrate.

The second active region is formed from a SEG film over the first device separating structure.

A line-type barrier film 120 is extended along a major axis direction of an active region 127 and formed in the device separating region between the active regions 127.

The barrier film 120 is formed deeper than the second device separating structure, and obtained by filling a line-type trench formed in the device separating region between the active regions 127.

The trench has a line-width ranging from about 10 to about 100 nm, and a depth ranging from about 300 to about 2000 Å.

The second active region extended to the side surface of the first active region is formed between the first active region and the barrier film 120. The second active region is obtained by growing a SEG film with a silicon layer of the first active region as a seed layer. The SEG film is formed to have the same height as that of the second device separating structure by a planarization process.

A recess gate 175 is formed perpendicular to the active region 127, and has a recess in the active region 127.

FIGS. 3a through 3i are cross-sectional diagrams illustrating a method for manufacturing a semiconductor device according to an embodiment of the present invention, FIGS. 3a through 3f show cross-sectional diagrams according to a-a' of FIG. 2.

Figure 3A:
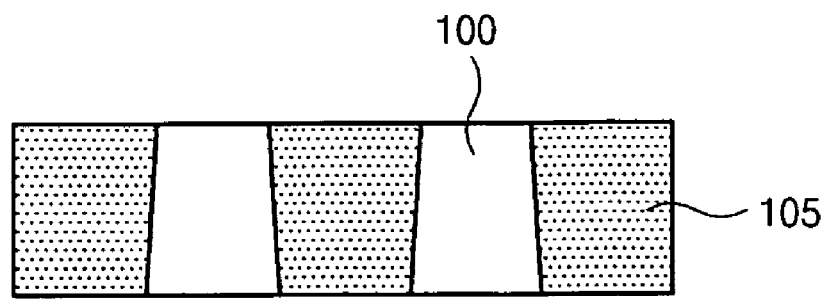
FIGS. 3a through 3i are cross-sectional diagrams illustrating a method for manufacturing a semiconductor device according to an embodiment of the present invention.

Referring to FIG. 3a, a trench for separating a device (not shown) is formed by etching a semiconductor substrate at a predetermined thickness. An oxide film for filling the trench for separating a device (not shown) is formed to obtain a first device separating structure 105 that defines a first active region 100.

Figure 3B:
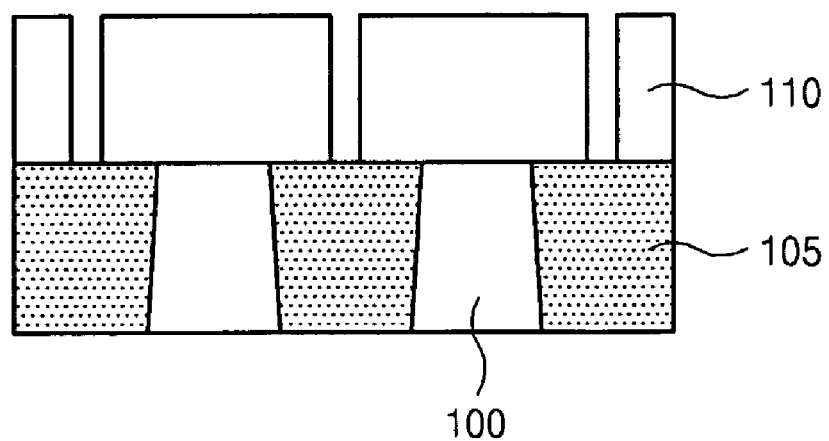

Referring to FIG. 3b, after a photoresist film (not shown) is formed over the resulting structure, an exposure and developing process is performed with an exposure mask where a local barrier film is defined, thereby obtaining a photoresist pattern 110.

The exposure mask is extended along the major axis direction of the first active region 100 so that a line-type space pattern is defined in the device separating region between the first active region 100.

Figure 3C:
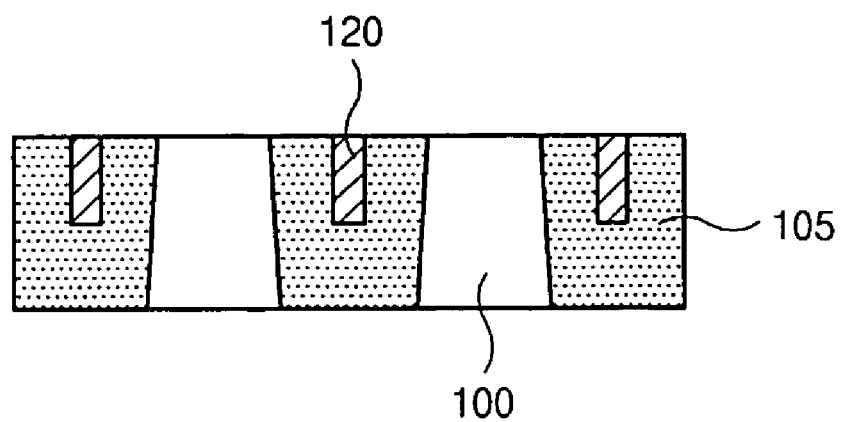

Referring to FIG. 3c, the first device separating structure 105 is etched with the photoresist pattern 110 as a mask to form a trench (not shown). Then, a barrier film 120 for filling the trench (not shown) is formed over the resulting structure.

The barrier film 120 is planarized to fill the trench (not shown).

The trench (not shown) has a line-width ranging from about 10 to about 100 nm, and a depth ranging from about 300 to about 2000 Å.

The barrier film 120 is formed from a nitride film, and has a thickness ranging from about 30 to about 500 Å over the first active region 100.

Figure 3D:
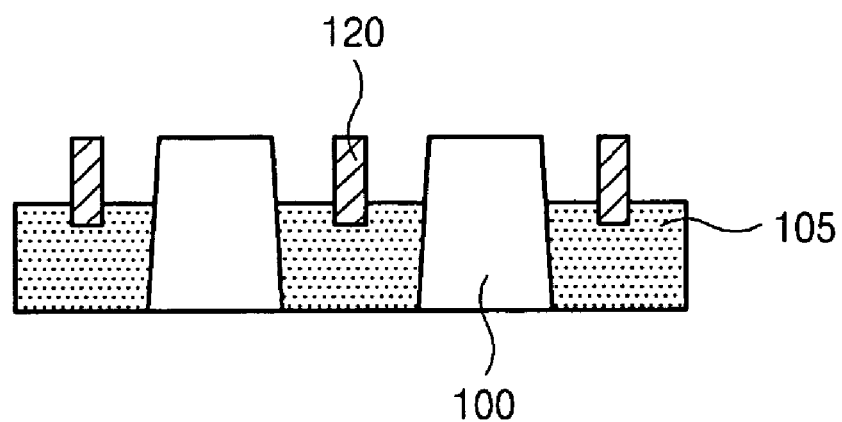

Referring to FIG. 3d, the first device separating structure 105 is etched at a predetermined thickness with the barrier film 120 and the first active region 100 as a mask to expose the sidewall of the first active region 100.

The above etching process is a wet-etching process with a HF or a BOE solution using a etching selectivity between the oxide film, which is the first device separating structure 105, and the nitride film, which is the barrier film 120. The first device separating structure 105 is etched at a depth ranging from about 100 to about 1500 Å so that the barrier film 120 remains ranging from about 33 to 75%.

Figure 3E:
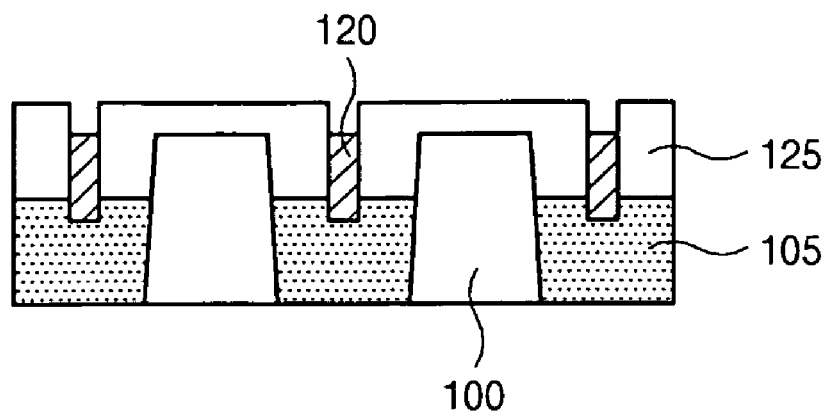

Referring to FIG. 3e, the SEG film is grown with the silicon layer of the first active region 100 as a seed layer so that the SEG film is extended from the first active region 100 to the side surface to form a second active region 125 overlapped with the first device separating structure 105.

Since the barrier film 120 is formed at both sides of the exposed active region 100, the SEG film is grown into the region having the barrier film 120 so as to have a thickness ranging from about 100 to about 2000 Å thereover.

Figure 3F:
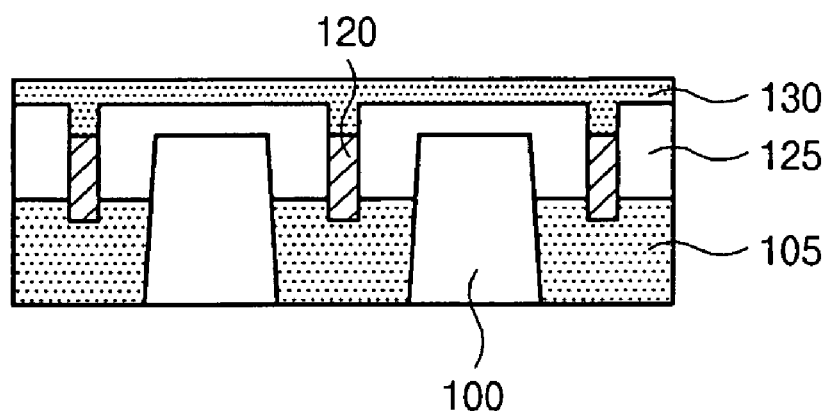

Referring to FIG. 3f, a second device separating structure 130 is formed between the second active regions 125.

The second device separating structure 130 is formed to have a thickness ranging from about 100 to 2000 Å. Since the second device film 130 is deposited with the first device separating structure 105, it is formed from an oxide film, which is the first device separating structure 105.

Figure 3G:
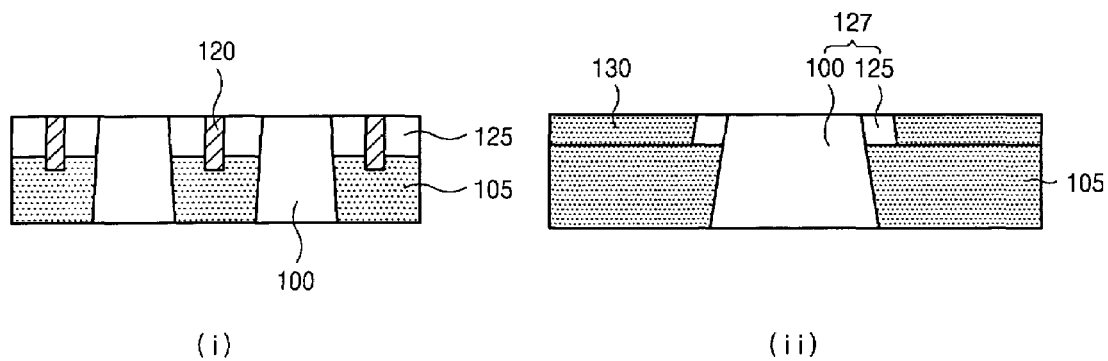

(i) of FIG. 3g shows a cross-section taken along a-a' of FIG. 2, and (ii) of FIG. 3g is a cross-section taken along b-b' of FIG. 2.

Referring to FIG. 3g, a planarization process is performed to expose the first active region 100 or the barrier film 120.

Referring to (ii) of FIG. 3g, the second device separating structure 130 is deposited over the first device separating structure 105, and etched at a predetermined thickness in FIG. 3d so that it is used as a device separating structure.

Figure 3H:
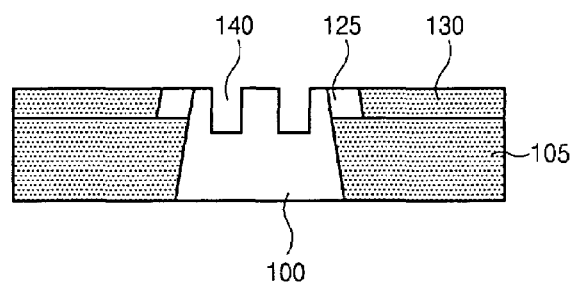

Referring to FIG. 3h, the first active region 100 and the second active region 125 are etched at a predetermined thickness to form a recess gate region 140.

Figure 3I:
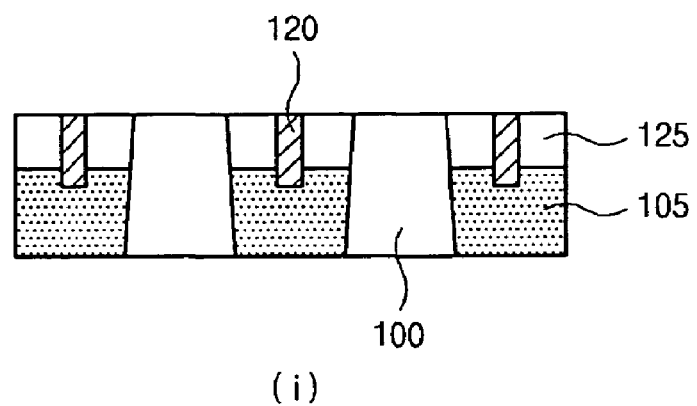
Figure 3I:
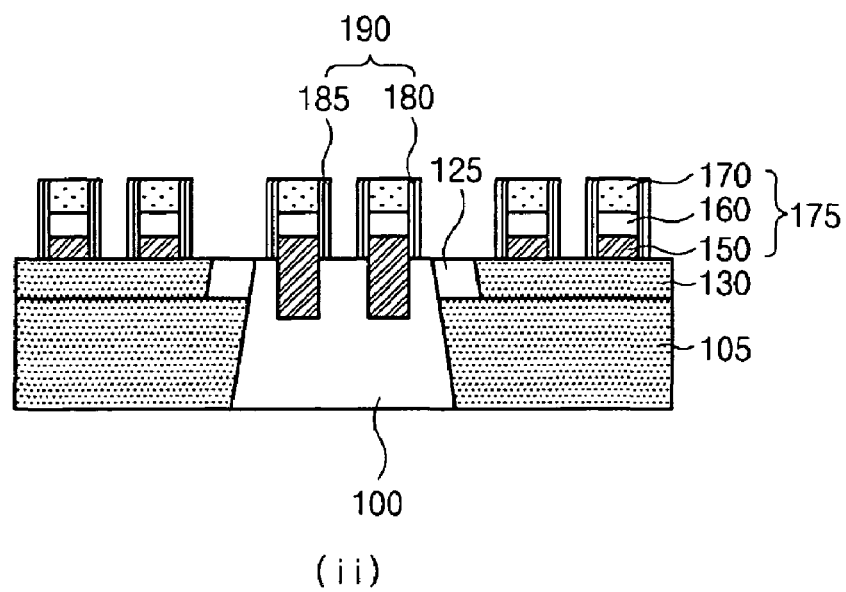
Figure 3I:
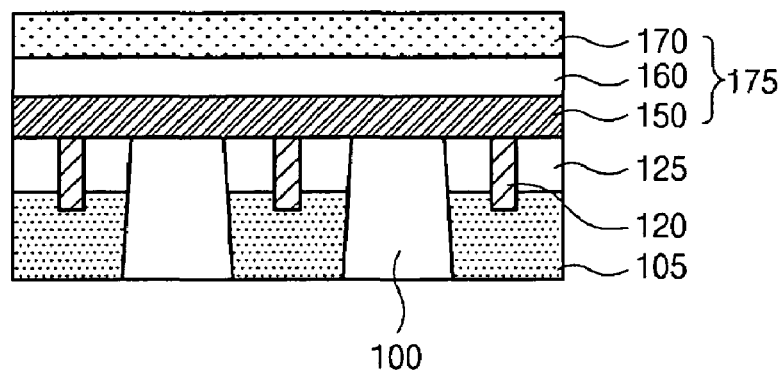

FIG. 3i, (i), (ii) and (iii) show cross-sections taken along a-a', b-b' and c-c' of FIG. 2. A gate oxide film (not shown) is formed over the semiconductor substrate including the recess gate region 140. Then, a deposition structure including a polysilicon layer 150, a gate metal layer 160 and a gate hard mask layer 170 is formed.

Next, the deposition structure is patterned to form a gate pattern 175. Then, a spacer 190 is formed at the sidewall of the gate pattern 175.

According to an embodiment of the present invention, a barrier film is formed in a device separating structure, and the device separating structure is etched at a predetermined thickness to expose a semiconductor substrate. Then, a SEG film is grown to form an active region whose area is increased. As a result, a current driving power of a transistor located at a cell region and peripheral circuit regions is improved.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or nonvolatile memory device. Other additions, subtractions, or modifications are obvious in view of the present disclosure and are intended to fall within the scope of the appended claims.

What is claimed is:

1. A semiconductor device comprising:
   a first device separating structure configured to define a first active region;
   a second device separating structure configured to define an epitaxial semiconductor region epitaxially grown from a side surface of an upper portion of the first active region, wherein the second device separating structure and the epitaxial semiconductor region are formed over the first device separating structure;
   a line-type barrier film extended along a first major direction of the semiconductor device; and
   a recess gate formed in a recess defined in the first active region along a second major direction of the semiconductor device perpendicular to the first major direction,
   wherein at least a portion of the line-type barrier film is formed inside the epitaxial semiconductor region, so as to divide the epitaxial semiconductor region into two separated second active regions; and,
   wherein the first and second active regions and the line-type barrier film form a top surface that is substantially planarized.

2. The semiconductor device according to claim 1, wherein the epitaxial semiconductor region is formed from a SEG film over the first device separating structure.

3. The semiconductor device according to claim 1, wherein a lower portion of the barrier film is formed deeper than the second device separating structure.

4. The semiconductor device according to claim 1, wherein the barrier film includes a nitride film filled in a line-type trench formed at least partially in the epitaxial semiconductor region.

5. The semiconductor device according to claim 4, wherein a width of the line-type trench ranges from 10 to 100 nm.

6. The semiconductor device according to claim 4, wherein a depth of the trench ranges from 300 to 2000 A.

7. The semiconductor device according to claim 1, wherein at least a portion of the line-type barrier film is formed over the first device separating structure and adjacent to the second device separating structure.

* * * * *